United States Patent [19]

Kenyon

[11] 3,784,917

[45] Jan. 8, 1974

[54] CONSTANT LOCK-IN RANGE AUTOMATIC FREQUENCY CONTROL

[75] Inventor: Roger Y. Kenyon, Hatfield, Pa.

[73] Assignee: Philco-Ford Corporation, Blue Bell, Pa.

[22] Filed: Dec. 15, 1972

[21] Appl. No.: 315,493

[52] U.S. Cl. ................. 325/422, 325/421, 325/423, 331/36 C, 334/16

[51] Int. Cl. ............................................ H04b 1/16

[58] Field of Search .................... 178/5.8 AF, 7.3 R; 325/346, 418–420, 422, 421, 423; 331/16, 36 R, 36 C, 36 L; 334/15, 16

[56] References Cited

UNITED STATES PATENTS 3,679,990 7/1972 Hiday ............................... 331/36 C 3,697,885 10/1972 Avins ................................ 325/422

*Primary Examiner*—Albert J. Mayer

*Attorney*—Robert D. Sanborn, Gail W. Woodward & William E. Denk

[57] ABSTRACT

In a voltage variable capacitor tuned superheterodyne receiver, the manual tuning voltage and the automatic frequency control voltage are ordinarily applied to separate voltage variable capacitor diodes connected to the local oscillator tuned circuit. Constant automatic frequency control lock-in range over the tuning band is achieved by applying a small fraction of the automatic frequency control voltage to the manual tuning capacitor.

7 Claims, 3 Drawing Figures

PATENTED JAN 8 1974 3,784,917

CONSTANT LOCK-IN RANGE AUTOMATIC FREQUENCY CONTROL

BACKGROUND OF THE INVENTION

Voltage variable capacitors (VVC's), usually in the form of reverse biased P-N junction diodes, are widely used as tuning elements in superheterodyne radio receivers. Tuning is accomplished by providing a stable, variable d-c voltage that can be obtained by any one of several means. Typically a potentiometer is provided with a stabilized or regulated d-c voltage. The potentiometer therefore provides a voltage that varies as a function of shaft rotation. Separate VVC elements are ordinarily provided to tune the receiver local oscillator, mixer, and r-f amplifier. These VVC elements are configured to operate from a single variable voltage source and yet track in terms of frequency versus voltage.

For automatic frequency control (AFC) operation the filtered d-c output of a frequency sensitive intermediate frequency detector can be applied to the VVC in thc local oscillator circuit. This however is not a simple matter. The AFC voltage must be combined with the manual tuning voltage, preferably in such a way that the two do not interact with each other. Ordinarily the AFC voltage operates or varies around a preset voltage, while the manual tuning voltage covers the range required by the tuning characteristic of the receiver. To simplify the problem it is a common practice to employ two VVC devices in the receiver local oscillator. They are capacitively coupled together so that they form a single electrical capacitance, but are isolated in terms of d-c bias. One VVC device is connected only to the manual tuning voltage source while the second is connected only to the AFC voltage source. This provides the required separation of function without interaction but leaves something to be desired in other respects. For example, when a receiver employing two such VVC's is tuned to the high frequency end of its range, the AFC portion of the circuit, which represents an essentially constant capacitance, has a much greater relative control action. In fact the AFC action is proportional to frequency. This means that AFC lockin range varies substantially over the receiver's tuning range.

SUMMARY OF THE INVENTION

It is an object of the invention to provide a VVC tuned superheterodyne receiver whose AFC lock-in range is independent of receiver tuning.

It is a further object to accomplish constant AFC lock-in range with a minimum of additional electrical components and at low cost.

These and other objects are achieved in the following manner. Two VVC controls are used in the local oscillator of the VVC tuned superheterodyne receiver. One VVC is connected to the variable source of d-c voltage that provides the manual tuning function. This source also provides the control for the VVC's used to tune the r-f amplifier and mixer tuning functions. The second local oscillator VVC is connected to and biased by the filtered d-c (i.e., AFC) output voltage of the frequency sensitive detector. The two VVC's are capacitively coupled together for r.f. so that the local oscillator frequency is determined by the combined VVC capacitances. Yet each VVC can be varied independently by electrically uncoupled d-c control circuits. I have discovered that, by applying to the manual tuning VVC a small fraction of the AFC voltage that is applied to the AFC VVC, the AFC lock-in range can be made substantially constant as the receiver is tuned across the band.

DESCRIPTION OF THE INVENTION

Figure 1:
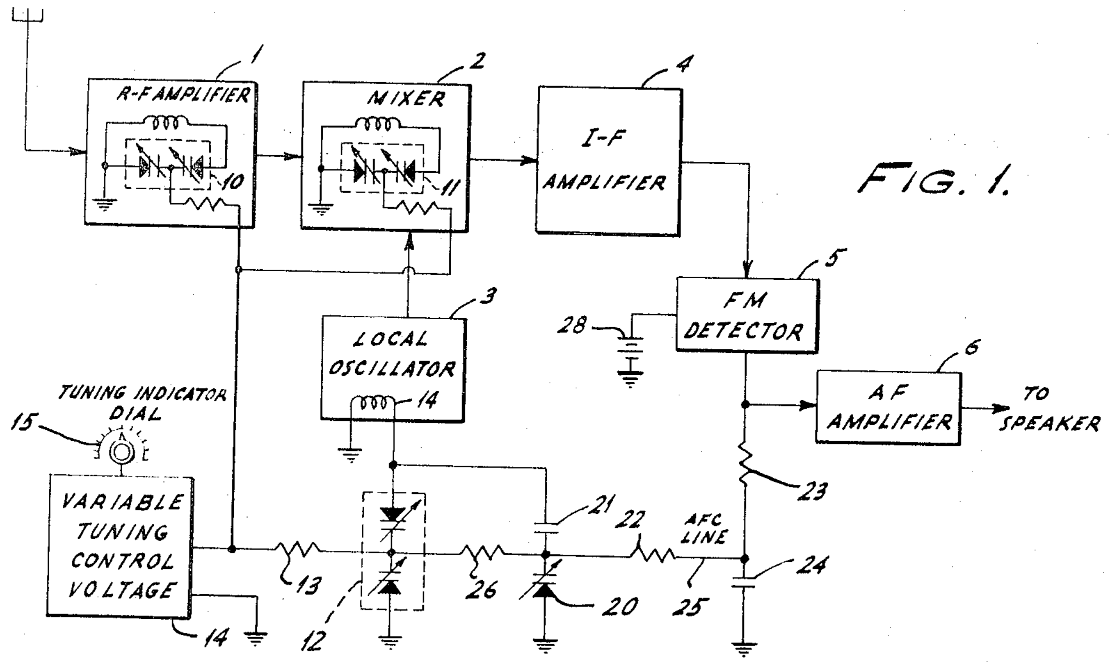
FIG. 1 is a diagrammatic illustration of a radio receiver employing the invention.

Referring to FIG. 1, a superheterodyne FM radio receiver is shown in partly schematic, partly block diagram form. An r-f amplifier 1 feeds a mixer 2, which is coupled to a local oscillator 3. Block 1 represents the usual transistor amplifier circuit, but only the tuned circuit thereof, consisting of an inductor and two series-connected VVC diodes 10, is shown since only these elements are necessary to a full understanding of the invention. Similarly, block 2 represents the usual transistor mixer (first detector circuit), but again only the tuning inductor and series-connected VVC diodes are shown. Local oscillator block 3 represents the usual transistor local oscillator circuit, but only the tuning inductor thereof is shown; the main tuning capacitors (the VVC diode pair 12) are shown schematically outside block 3 and will be described in detail hereinafter. The intermediate frequency output from mixer 2 is amplified in i-f amplifier 4 and demodulated in f—m detector 5. The audio signal from the detector is amplified in a-f amplifier 6 and applied to a loudspeaker or other form of sound reproducer.

The FM detector 5 is ordinarily a discriminator or ratio detector that produces, in addition to the audio frequency output, a d-c output voltage the amplitude of which is related to the carrier frequency of the i—f signal. This voltage is used, as is well known to control the frequency of the local oscillator so as to provide automatic frequency control, or AFC, of the receiver tuning. AFC is employed to minimize the effects of tuning drift and to make tuning easier for the user of the receiver. In practice the user need only tune the receiver approximately to that point on the dial where the desired station is received. The AFC system will then fine tune the receiver to the station. The range over which the AFC system will perform is called the lock-in range. In a standard FM broadcast receiver, due to the assigned channel spacing, the preferred lock-in range is just under ± 300KHz and should be reasonably constant over the FM band — 88–108 MHz.

The receiver is tuned by means of VVC elements. The r-f amplifier is tuned by VVC diode pair 10, the mixer is tuned by VVC diode pair 11, and the local oscillator is tuned by VVC diode pair 12. Each of these elements is shown in its preferred back-to-back diode form. Reverse diode bias is applied to the juncture of the diodes through isolating resistors, such as resistor 13 in the case of the local oscillator. The diodes appear in series across their associated inductor element, such as inductor 14 in the oscillator. The VVC elements 10, 11 and 12 are so selected, in a manner well known to those skilled in the art, that their capacitance-versus-voltage characteristics cause their tuning characteristics to track when they are operated from a common tuning voltage source (in some instances it may be necessary to add the usual trimmer and/or padder condensers). Thus, these circuits combine to produce a constant 10.7 MHz intermediate frequency over the 88–108 MHz band.

The VVC elements 10, 11 and 12 are shown operated from a single d-c voltage source 14 which, when mechanically operated, produces a variable d-c voltage output. Source 14 may comprise, as is well known, a suitabls source of fixed d-c voltage shunted by a manually variable potentiometer, from whose movable element can be derived a variable tuning control voltage representing a variable fraction of said fixed voltage. The position of said movable element may be indicated on dial 15 which can be marked in terms of frequency, or any other desired indication such as FM channel number.

Oscillator 3, in addition to its main tuning capacitors 12, is fine-tuned by AFC VVC 20 which, with coupling capacitor 21, is also connected across tuning inductor 14. While this device could be of the back-to-back diode variety of VVC 12, a single diode has been used in this instance. The AFC bias on VVC 20 is applied by way of isolation resistor 22. The AFC voltage is derived from the output of FM detector 5 by way of a low pass filter composed of resistor 23 and capacitor 24. FM detector 5 is provided with a reference potential, shown in the drawing as battery 28, polarized so that VVC 20 is always reversed biased. Thus AFC line 25 supplies a range of potentials of one polarity which potentials increase and decrease as detector 5 receives frequencies higher or lower than the desired i-f. The action of the system is conventional in the sense that VVC 20 varies the tuning of local oscillator 3 so that the i-f signal from mixer 2 is driven toward the desired i-f.

Figure 2:
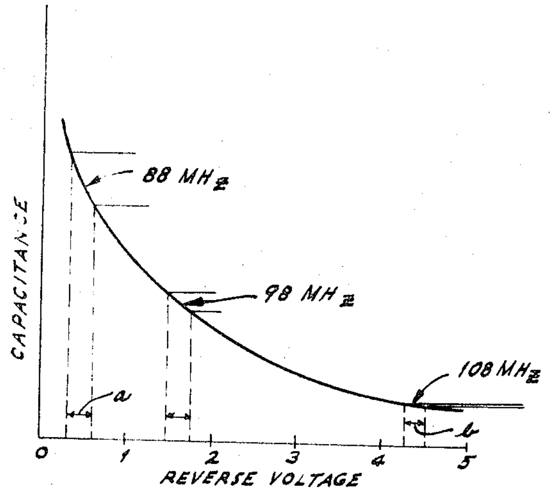
FIG. 2 is a graph showing how the capacitance of a VVC varies with bias voltage.

FIG. 2 shows how VVC capacitance varies with applied voltage. For low reverse bias, or maximum capacitance, the device will tune the circuits to the 88 MHz end of the band and it can be seen that a small change in voltage as indicated at a will produce a substantial change in capacitance and hence frequency. The same change in voltage at the 108 MHz end of the band, as shown at *b*, produces a much smaller change in capacitance and hence tuning. From this curve it can be seen that if the AFC voltage were to be applied to the VVC to which the manual tuning voltage were applied, the AFC sensitivity would be large at the low end of the band and small at the high end of the band. In such case, AFC sensitivity is inversely proportional to frequency.

Figure 3:
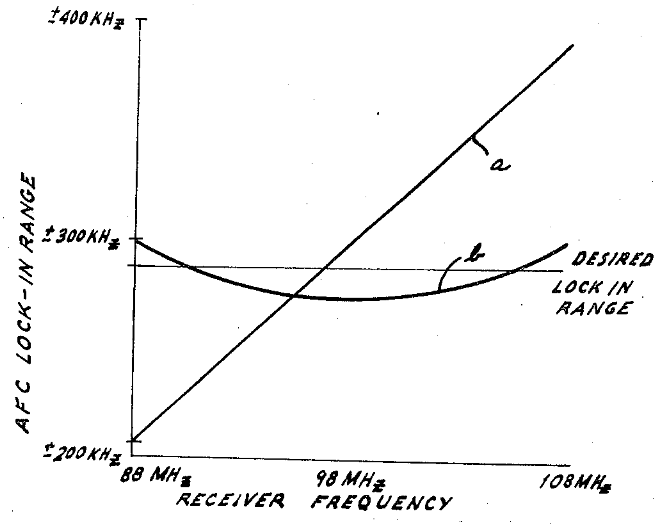
FIG. 3 is a graph showing AFC lock-in range as a function of receiver tuning frequency with and without the invention.

If instead a separate VVC is used for AFC as shown in FIG. 1, it can be seen that a different situation occurs. VVC 20 will maintain a constant average capacitance while the capacitance of VVC 12 will be high at the low end of the frequency band and low at the high frequency band. Accordingly a particular change in capacitance in VVC 20 will have less relative effect at low frequency and greater relative effect at higher frequency. Thus AFC sensitivity will be directly proportional to frequency. This is shown in FIG. 3 as curve a.

The arrangements described in the two preceding paragraphs provide AFC characteristics which differ radically from the ideal in which AFC sensitivity would be independent of frequency. However, in accordance with the present invention, the ideal AFC characteristic can be very closely approximated by providing a coupling resistor between the junction of the two VVC diodes 12 and the upper terminal of VVC 20. The action of resistor 26 is to apply a portion of the voltage from AFC line 25 to VVC 12. Resistor 26 acts as a voltage divider in conjunction with resistors 13, 22, and 23. Its value is selected to apply the desired fraction of AFC voltage to VVC 12. By a suitable selection of resistor 26 the curve of line *b* of FIG. 3 is obtained. It can be seen that curve *b* sags in the middle, but the maximum departure from the desired value is never excessive. The actual value crosses the desired value twice.

From the above it can be seen that the circuit of FIG. 1 provides an AFC characteristic that very closely approaches the ideal. In one physical embodiment of the invention the following component values have produced the desired circuit action:

| | |
|---|---|
| Resistor **13** | 100 k ohms |
| Capacitor **21** | 8.2 pf |
| Resistor **22** | 100 k ohms |
| Resistor **23** | 100 k ohms |
| Capacitor **24** | 0.05 $\mu$f |
| Resistor **26** | 6.8 M ohms |

While the foregoing description details a preferred embodiment of my invention, numerous alternatives will occur to a person skilled in the art. For example while an FM broadcast receiver is shown, a television or other type of receiver could be used. Also other forms of VVC devices could be employed. It is intended that the scope of my invention be limited only by the following claims.

I claim:

1. A voltage variable capacitor tuned superheterodyne receiver having an r-f section, a converter section, an i-f section operating at a predetermined intermediate frequency and automatic frequency control comprising:

a source of variable manual tuning potential, a frequency controlled local oscillator connected to said converter, a first voltage variable capacitor connected to said local oscillator in frequency varying relation and connected to said source to provide the local oscillator tuning function, a frequency discriminating detector connected to said i-f section to produce a d-c output that varies as a function of said intermediate frequency, a second voltage variable capacitor connected to said local oscillator in frequency varying relation and biased by the output of said detector for automatically tuning said local oscillator, said automatic tuning being ordinarily characterized as having increased lock-in range at the higher tuning frequencies, and means for coupling a predetermined fraction of the output of said detector to said first voltage variable capacitor to provide essentially constant automatic frequency control lock-in range as a function of receiver tuning frequency.

2. The receiver of claim 1 wherein said coupling means comprises a resistor.

3. The receiver of claim 2 wherein said resistor is connected between said first and said second voltage variable capacitors.

4. In a superheterodyne receiver having a predetermined intermediate frequency and automatic frequency control of the receiver local oscillator obtained by the action of a frequency discriminator operating at said intermediate frequency, said receiver employing voltage variable capacitor tuning elements, said local oscillator having a first voltage variable capacitor tuning element connected to a source of variable voltage to provide the tuning function of said receiver and a second voltage variable capacitor tuning element connected to said discriminator to provide the automatic tuning function of said receiver, wherein the lock-in range of said automatic frequency control is ordinarily proportional to the frequency of said local oscillator, the improvement comprising:

means for applying a fraction of said discriminator output to said first voltage variable capacitor to provide essentially constant automatic frequency control lock-in range as a function of local oscillator frequency.

5. The improvement of claim 4 wherein the last named means comprises a resistor.

6. The improvement of claim 5 wherein said resistor is connected between said first and said second voltage variable capacitors.

7. A superheterodyne radio receiver adapted to be tuned over a frequency band to any desired signal in said band, said receiver comprising an r-f input circuit, a mixer connected to said r-f input circuit, a local oscillator connected to an input circuit of said mixer, an i-f amplifier connected to the output of said mixer, and a frequency discriminating detector connected to the output of said i-f amplifier, said receiver also comprising:

means including a voltage variable capacitance device for tuning said r-f input circuit over said band;

means including a voltage variable capacitance device for tuning said mixer over said band;

means including a voltage variable capacitance device for tuning said local oscillator over a different frequency band of comparable width;

a source of variable tuning control voltage, and means for applying said voltage to said voltage variable capacitance devices for tuning said input circuit and said mixer to the desired r-f signal and for tuning said local oscillator to a frequency which differs from the frequency of said desired r-f signal by approximately said i-f;

means including an auxiliary voltage variable capacitance device connected to said local oscillator for effecting automatic fine tuning of said local oscillator in response to a voltage derived from said frequency discriminating detector and applied to said auxiliary voltage variable capacitance device, said automatic fine tuning being characterized as tending to have greater lock-in range at the higher tuning frequencies and lesser lock-in range at the lower tuning frequencies;

and means for combining with the variable tuning control voltage applied to said first-named local oscillator voltage variable capacitance device a predetermined fraction only of the voltage applied to said auxiliary voltage variable capacitance device, whereby to provide a substantially constant lock-in range over the frequency band through which said receiver is tunable.

* * * * *